United States Patent
Yan et al.

(10) Patent No.: US 9,880,434 B2
(45) Date of Patent: Jan. 30, 2018

(54) ARRAY SUBSTRATE, DISPLAY PANEL, DISPLAY DEVICE AND METHOD OF REPAIRING DISPLAY PANEL

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventors: Shaning Yan, Beijing (CN); Bo Shi, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan (CN)

( * ) Notice: Subject to any disclaimer, the term of this patent is extended or adjusted under 35 U.S.C. 154(b) by 0 days.

(21) Appl. No.: 14/891,841

(22) PCT Filed: Jul. 10, 2015

(86) PCT No.: PCT/CN2015/083723
§ 371 (c)(1),
(2) Date: Nov. 17, 2015

(87) PCT Pub. No.: WO2016/045431
PCT Pub. Date: Mar. 31, 2016

(65) Prior Publication Data
US 2016/0291432 A1   Oct. 6, 2016

(30) Foreign Application Priority Data

Sep. 28, 2014  (CN) .......................... 2014 1 0508740

(51) Int. Cl.
*H01L 29/08* (2006.01)
*G02F 1/1362* (2006.01)
(Continued)

(52) U.S. Cl.
CPC .. *G02F 1/136209* (2013.01); *G02F 1/136259* (2013.01); *G02F 1/136286* (2013.01);
(Continued)

(58) Field of Classification Search
CPC ... H01L 27/326; H01L 27/322; H01L 27/124; H01L 51/5284; H01L 51/56; H01L 29/78633
(Continued)

(56) References Cited

U.S. PATENT DOCUMENTS

2007/0132371 A1\* 6/2007 Liu ........................... G02F 1/15
                                                                                    313/504
2010/0156765 A1\* 6/2010 Park .................... H01L 27/3232
                                                                                      345/77
(Continued)

FOREIGN PATENT DOCUMENTS

CN       101093295 A       12/2007
CN       101101401 A        1/2008
(Continued)

OTHER PUBLICATIONS

Machine English translation of reference KR20060135425.\*
(Continued)

*Primary Examiner* — Trung Q Dang
(74) *Attorney, Agent, or Firm* — Ladas & Parry LLP

(57) ABSTRACT

An array substrate, a display panel, a display device and a method of repairing a display panel are provided. The array substrate includes a functional layer and a photochromic layer disposed on the functional layer, and upon the array substrate suffering from light leakage, the photochromic layer in a light leakage area is irradiated by light to form a light blocking part in the light leakage area, thereby repairing light leakage of the array substrate.

13 Claims, 2 Drawing Sheets

(51) Int. Cl.
    *H01L 27/12*      (2006.01)
    *H01L 29/786*     (2006.01)
(52) U.S. Cl.
    CPC ...... *H01L 27/124* (2013.01); *H01L 29/78633* (2013.01); *G02F 2001/136222* (2013.01); *G02F 2201/123* (2013.01); *G02F 2202/02* (2013.01); *G02F 2202/14* (2013.01); *G02F 2203/05* (2013.01)
(58) Field of Classification Search
    USPC .............................................. 257/40; 438/27
    See application file for complete search history.

(56) References Cited

U.S. PATENT DOCUMENTS

| | | | |
|---|---|---|---|
| 2015/0028294 A1* | 1/2015 | Kim | H01L 27/322 257/40 |
| 2015/0048316 A1* | 2/2015 | Choi | H01L 51/5284 257/40 |

FOREIGN PATENT DOCUMENTS

| | | |
|---|---|---|
| CN | 101576709 A | 11/2009 |
| CN | 101581852 A | 11/2009 |
| CN | 202837747 U | 3/2013 |
| CN | 104297985 A | 1/2015 |
| JP | 2008-195744 A | 8/2008 |
| KR | 20060135425 A | 12/2006 |

OTHER PUBLICATIONS

International Search Report & Written Opinioin Appln. No. PCT/CN2015/083723; dated Sep. 23, 2015.

First Chinese Office Action dated Aug. 1, 2016; Appln. No. 201410508740.6.

Second Chinese Office Action dated Mar. 21, 2017; Appln. No. 201410508740.6.

* cited by examiner

ARRAY SUBSTRATE, DISPLAY PANEL, DISPLAY DEVICE AND METHOD OF REPAIRING DISPLAY PANEL

TECHNICAL FIELD

Embodiments of the present invention relate to an array substrate, a display panel, a display device and a method of repairing a display panel.

BACKGROUND

With the development of display manufacturing technology, TFT-LCD (Thin Film Transistor Liquid Crystal Display, a thin film transistor liquid crystal display) plays a leading role in the current flat panel display market owing to its advantages such as small size, low consumption, no radiation and the like. An array substrate is an important component of a liquid crystal display device. Aperture ratio is an important index evaluating an array substrate. The greater the aperture ratio is, the higher the light transmittance of the array substrate will be, and therefore the higher the brightness of TFT-LCD using the array substrate will be and the better the display effect of the liquid crystal display will be.

Existing array substrates typically encounter the problem of light leakage, which is generally solved by broadening a black matrix. Aperture ratio is equal to the ratio of the area of the light-transmitting portion in a pixel to the total area of the pixel. However, a black matrix is not light-transmitting and broadening thereof will reduce the area of the light-transmitting portion in the pixel. Therefore, by broadening a black matrix to solve light leakage of an array substrate in the prior art, the aperture ratio of TFT would be reduced, thereby reducing the transmittance of the array substrate.

SUMMARY

An array substrate comprising a functional layer and a photochromic layer, wherein the photochromic layer is disposed on the functional layer, and upon the array substrate suffering from light leakage, the photochromic layer in a light leakage area can be irradiated by light to form a light blocking part in the light leakage area.

In one embodiment of the present invention, the photochromic layer is disposed on the outmost surface of the functional layer.

In one embodiment of the present invention, the functional layer is disposed on a base substrate and comprises one or more of a pixel electrode layer, an insulating layer, a data line layer, a gate insulating layer and a gate layer disposed sequentially in a direction from a position away from the base substrate towards a position near to the base substrate.

In one embodiment of the present invention, the photochromic layer is disposed on the outer surface of the pixel electrode layer.

In one embodiment of the present invention, the photochromic layer is composed of an organic photochromic material.

In one embodiment of the present invention, the organic photochromic material comprises diaryl ethenes, spiro thiopyrans, spirooxazines, fulgides and derivatives thereof.

Embodiments of the present invention further provide a display panel, comprising the above array substrate.

In one embodiment of the present invention, the display panel further comprises a substrate cell-assembled to the array substrate, and when the display panel exhibits light leaking, the light leakage area of the photochromic layer can be irradiated by light to form a light blocking part in the light leakage area.

Embodiments of the present invention further provide a display device, comprising the above display panel.

Embodiments of the present invention further provide a method of repairing a display panel comprising the above array substrate, the method comprising:

irradiating the light leakage area of the photochromic layer with light to make it form the light blocking part.

In one embodiment of the present invention, the light is ultra-violet light.

BRIEF DESCRIPTION OF THE DRAWINGS

In order to clearly illustrate the technical solutions of embodiments of the present invention, the drawings for the embodiments will be briefly described in the following; it is obvious that the described drawings are only related to some embodiments of the present invention and thus are not limitative of the invention.

DETAILED DESCRIPTION

In order to make objects, technical details and advantages of the embodiments of the present invention apparent, the technical solutions of the embodiments will be described in a clearly and fully understandable way in connection with the drawings related to the embodiments of the present invention. Apparently, the described embodiments are just a part but not all of the embodiments of the invention. Based on the embodiments described herein, those skilled in the art can obtain other embodiment(s), without any creative work, which fall within the scope of the invention.

The embodiments of the present invention will be described in detail according to the figures.

As described in the present invention, specific features, structures, materials or characteristics can be combined in a suitable way in any one or more embodiments or examples.

Embodiment 1

With regard to the problem of a smaller aperture ratio resulting from poor light leakage upon repairing an array substrate in the prior art, embodiments of the present invention provide an array substrate and a display device.

Figure 1:
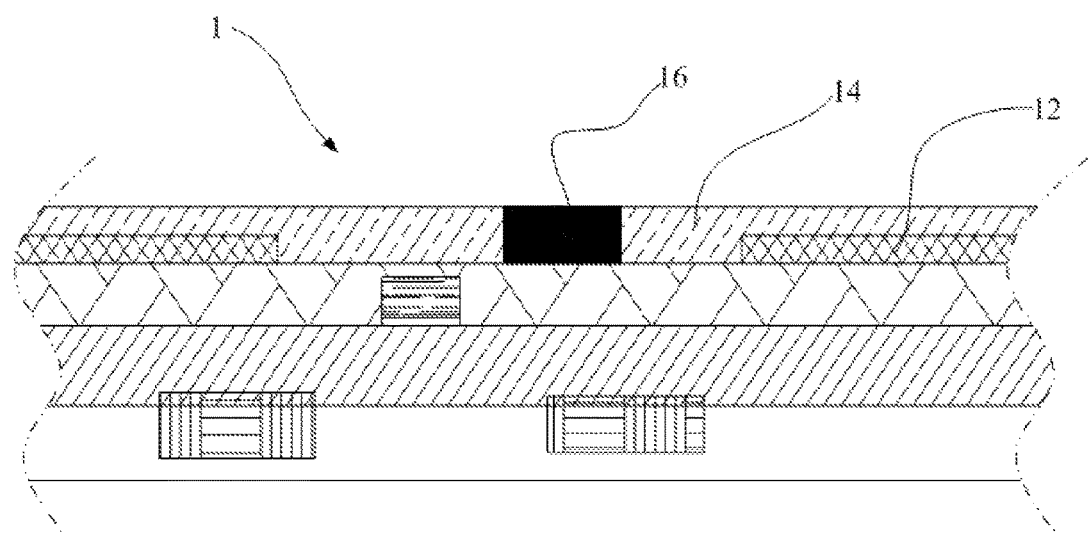
FIG. 1 is a sectional schematic diagram of an array substrate according to an embodiment of the present invention.

FIG. 1 is a sectional schematic diagram of an array substrate according to an embodiment of the present invention. Referring to FIG. 1, in one embodiment of the present invention, a photochromic layer 14 may be disposed on a pixel electrode layer 12 in an array substrate 1, and then the array substrate is made cell-assembled to an cell-assembling substrate according to a normal production process, resulting in a module or a display panel not attached with a polaroid. Below the pixel electrode layer 12, a gate metal layer, a gate insulating layer, a source-drain metal layer and the like may also be provided. The pixel electrode layer 12 and the photochromic layer 14 can also be coated with a photometric alignment layer (transmittance matching layer).

Afterwards, the resultant module or display panel is subjected to light leaking inspection. When the array substrate 1 is found to exhibit light leaking, the light leakage area may be irradiated using a light beam, for example, the light beam may be ultraviolet light. When the photochromic layer 14 is irradiated by ultraviolet light, it will absorb ultraviolet light to form a light blocking part 16 which serves the function of light shielding, thereby repairing poor light leakage on the array substrate 1. As the width of the black matrix on the black matrix layer remains the same upon repairing poor light leakage of the array substrate 1, the entire aperture ratio of the array substrate 1 is not affected, thereby ensuring the entire transmittance of the array substrate 1.

Figure 2:
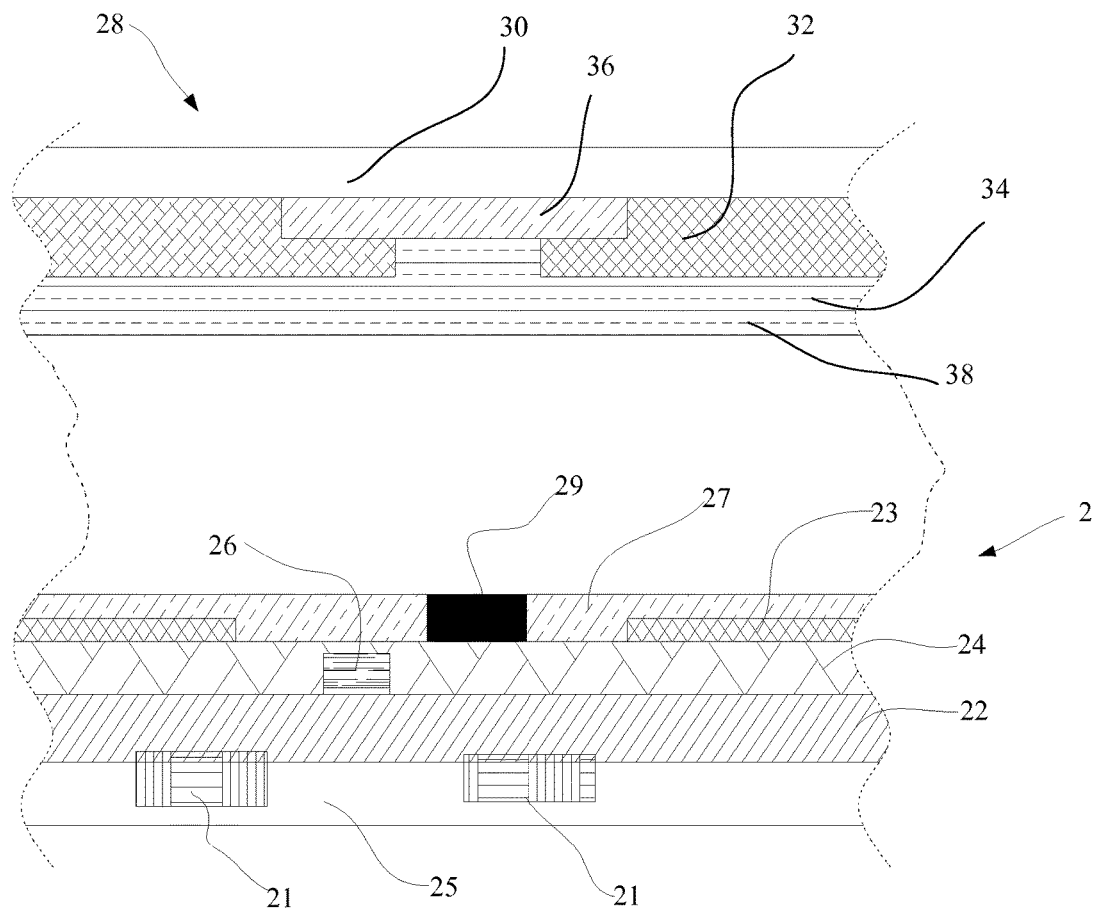
FIG. 2 is a sectional schematic diagram of a display panel according to an embodiment of the present invention.

Referring to FIG. 2, another embodiment of the present invention provides an array substrate 2, comprising a functional layer and a photochromic layer 27 disposed on the functional layer, where the function layer may comprise one or more of a gate metal layer (comprising a gate electrode and a gate line), a gate insulating layer, a data line layer (comprising a source electrode, a drain electrode and a data line), and a pixel electrode. When the array substrate 2 exhibits light leaking, the photochromic layer 27 is irradiated by light to form a light blocking part 29.

In the array substrate 2 provided in the embodiments of the present invention, since the photochromic layer 27 is disposed on the functional layer, when the array substrate 2 is found to exhibit light leaking upon inspection, the photochromic layer 27 in the light leakage area may be irradiated by light to form a light blocking part 29 in the light leakage area, thereby repairing poor light leakage of the array substrate 2.

In order to reduce the difficulty of the preparation process, the photochromic layer 27 may be disposed on the outmost surface of the functional layer.

FIG. 2 is a sectional schematic diagram of a display device according to an embodiment of the present invention. For example, the functional layer may be disposed on a base substrate 25. For another example, the functional layer may comprise a pixel electrode layer 23, an insulating layer 24, a data line layer 26, a gate insulating layer 22 and a gate layer 21 disposed sequentially in a direction from a position away from the base substrate towards a position near to the base substrate 25. The photochromic layer 27 is disposed on the outmost surface of the pixel electrode layer 23.

Referring to FIG. 2, since the photochromic layer 27 has no impact on the function of the array substrate 2, poor light leakage of the array substrate 2 can be repaired by disposing the photochromic layer 27 on any layer of the functional layer without affecting the aperture ratio of the array substrate 2. The photochromic layer 27 can be disposed not only on the outmost surface of the pixel electrode layer 23, but also on the insulating layer 24 or other functional layers. Needless to say, the array substrate 2 is not limited to comprising the above functional layers. Rather, the array substrate 2 may comprise more layer structures. For example, the array substrate 2 may further comprise a public electrode layer when it is an array substrate used for ADS type LCDs. Then, the photochromic layer 27 can be formed on the public electrode layer. Alternatively, the array substrate 2 may further comprise a color film layer when it is a COA (Color filter on Array) type array substrate. Then, the photochromic layer 27 can be formed on the color film layer.

The photochromic layer 27 can be composed of an organic photochromic material. In recent years, organic photochromic materials have received more and more popularity owing to their mature development, and selecting them to make the photochromic layer 27 can ensure the stability of the performance of the light blocking part 29, thereby guaranteeing the rate of find products of the array substrate 2 to a great extent.

There are a wide variety of organic photochromic materials, mainly including, for example, diaryl ethenes, spiro thiopyrans, spirooxazines, fulgides and derivatives thereof, proton transfer systems, and other photochromic systems. For example, diaryl ethenes, Spiro thiopyrans, spirooxazines, fulgides and derivatives thereof may be chosen from numerous organic photochromic materials to make the photochromic layer 27. Owing to the stable performance of the above compounds, good photochromic effects are achieved, which ensures the rate of fine products of the array substrate 2.

In the above embodiments provided in the present invention, the photochromic layer may be disposed on a pixel electrode layer in an array substrate, and then the array substrate is made cell-assembled according to a normal production process, resulting in a module or a liquid crystal display not attached with polaroid. Afterwards, the module or liquid crystal display is subjected to light leaking inspection. When the array substrate is found to exhibit light leaking, the light leakage area may be irradiated using a light beam, for example, the light beam may be ultraviolet light. When the light leakage area of the photochromic layer is irradiated by ultraviolet light, the photochromic layer will absorb ultraviolet light to form a light blocking part which serves the function of light shielding, thereby repairing poor light leakage on the array substrate. As the width of the black matrix on the black matrix layer remains the same upon repairing the array substrate, the aperture ratio of the array substrate is not affected, thereby ensuring the transmittance of the array substrate.

Embodiment 2

The present embodiment provides a display panel, comprising the above array substrate 2 comprising a functional layer. Since the photochromic layer 27 is disposed on the functional layer, when the array substrate 2 is found to exhibit light leaking upon inspection, the photochromic layer 27 in the light leakage area may be irradiated by light to form a light blocking part 29 in the light leakage area, thereby repairing poor light leakage of the array substrate 2 and further repairing poor light leakage of the display panel.

Referring to FIG. 2, the above display panel may further comprise an cell-assembling substrate 28 cell-assembled to the array substrate 2. The cell-assembling substrate 28 is, for example, a color film substrate, comprising a base substrate 30, a black matrix 36, a color filter unit 32 and a protective layer 36. The color filter unit 32 comprises, for example, red, green and blue color filter units. When the display panel is, for example, a TN type, the cell-assembling substrate 28 may further comprise a public electrode layer 38 disposed on the protective layer 36; when the display panel is, for example, an IPS type, the cell-assembling substrate 28 may not comprise a public electrode layer 38. When the display panel exhibits light leaking, the light leakage area of the photochromic layer 27 is irradiated by light to form a light blocking part 29 so as to repair poor light leakage of the display panel. Since the display panel comprises the above array substrate 2, it has the same beneficial effect as the array substrate 2, and no further detail will be given herein.

Embodiment 3

The present embodiment provides a display device, comprising the above display panel. The display panel comprises the above array substrate 2 comprising a functional layer. Since the photochromic layer 27 is disposed on the functional layer, when the array substrate 2 is found to exhibit light leaking upon inspection, the light leakage area of the photochromic layer 27 may be irradiated by light to form a light blocking part 29 in the light leakage area, thereby repairing poor light leakage of the array substrate 2 and further repairing poor light leakage of the display device.

Embodiment 4

The present embodiment provides a method of repairing a display panel comprising the above array substrate 2, the method comprising: irradiating the photochromic layer 27 in the light leakage area with light when the display panel exhibits light leaking, for example, irradiating the light leakage area of the photochromic layer 27 to make it form a light blocking part 29, thereby repairing poor light leakage of the display panel.

The above are merely exemplary embodiments of the present invention, and are not intended to limit the scope of protection of the present invention, which is yet determined by the appended claims.

The present application claims the priority of the Chinese patent application No. 201410508740.6 submitted on Sep. 28, 2014, and the content disclosed in the above Chinese patent application is incorporated herein by reference as part of the present application.

The invention claimed is:

1. An array substrate, comprising a functional layer and a photochromic layer, wherein the photochromic layer is disposed on the functional layer, and upon the array substrate suffering from light leakage, and the photochromic layer in a light leakage area can be irradiated by light to form a light blocking part in the light leakage area;
wherein the pixel electrode layer and the photochromic layer are coated with a photometric alignment layer.

2. The array substrate according to claim 1, wherein the photochromic layer is disposed on an outmost surface of the functional layer.

3. The array substrate according to claim 2, wherein the functional layer is disposed on a base substrate and comprises one or more of a pixel electrode layer, an insulating layer, a data line layer, a gate insulating layer and a gate layer disposed sequentially in a direction from a position away from the base substrate towards a position near to the base substrate.

4. The array substrate according to claim 3, wherein the photochromic layer is disposed on an outer surface of the pixel electrode layer.

5. The array substrate according to claim 1, wherein the photochromic layer is composed of an organic photochromic material.

6. The array substrate according to claim 5, wherein the organic photochromic material comprises diary ethenes, spiro thiopyrans, spirooxazines, fulgides and derivatives thereof.

7. A display panel, comprising the array substrate according to claim 1.

8. The display panel according to claim 7, wherein the display panel further comprises a substrate cell-assembled to the array substrate, and upon the array substrate suffering from light leakage, and the light leakage area of the photochromic layer can be irradiated by light to form a light blocking part in the light leakage area.

9. A method of repairing a display panel comprising the array substrate according to claim 1, the method comprising:
irradiating the light leakage area of the photochromic layer with light to turn the light leakage area into the light blocking part.

10. The method of repairing a display panel according to claim 9, wherein the light is ultra-violet light.

11. The array substrate according to claim 2, wherein the photochromic layer is composed of an organic photochromic material.

12. The array substrate according to claim 3, wherein the photochromic layer is composed of an organic photochromic material.

13. A display device, comprising the display panel according to claim 8.

* * * * *